United States Patent [19]

Hasegawa

[11] 4,349,747
[45] Sep. 14, 1982

[54] SOUND RESPONSE TIME SWITCH FOR FLOWING CURRENT FOR A PREDETERMINED PERIOD OF TIME

[75] Inventor: Bungo Hasegawa, Machida, Japan

[73] Assignee: Ozen Corp., Machida, Japan

[21] Appl. No.: 226,937

[22] Filed: Jan. 21, 1981

[30] Foreign Application Priority Data

Jan. 30, 1980 [JP] Japan .................................. 55/9736

[51] Int. Cl.³ ...................... H01H 35/00; H04R 17/00
[52] U.S. Cl. .................................. 307/117; 179/110 A
[58] Field of Search ....................... 307/116, 117, 118; 179/110 A, 1 VC; 200/61.01, DIG. 20

[56] References Cited

U.S. PATENT DOCUMENTS

| | | | |
|---|---|---|---|
| 3,440,347 | 4/1969 | Spencer et al. | 307/117 X |
| 3,582,671 | 6/1971 | Ott | 307/117 |
| 3,638,052 | 1/1972 | Massa | 179/110 A X |
| 3,710,040 | 1/1973 | Swinehart | 179/110 A |

OTHER PUBLICATIONS

Voice Operated Control Switch, Elector, Dec. 1979, vol. 5, pp. 12-40 to 12-41.
A Sound Controlled Switch by P. Martin, Revista Espanola de Electronica, vol. 27, pp. 30-31, Aug.-Sep., 1980.

Primary Examiner—Michael L. Gellner
Attorney, Agent, or Firm—Basile, Weintraub & Hanlon

[57] ABSTRACT

A sound received by a diaphragm is converted by means of a piezo-electric element into an electric current and amplified. The amplified current functions to cause both a monostable multi-vibrator circuit and a load drive circuit to operate in cooperation to close a circuit to an actuator for a predetermined period of time so as to allow it to actuate the load for the predetermined period.

10 Claims, 5 Drawing Figures

SOUND RESPONSE TIME SWITCH FOR FLOWING CURRENT FOR A PREDETERMINED PERIOD OF TIME

BACKGROUND OF THE INVENTION

I. Field of the Invention

This invention relates to a switch which closes an electric circuit to operate a load for a predetermined period of time in response to a sound.

More particularly, the present invention relates to a switch comprising in combination a diaphragm for receiving a sound, a piezo-electric element operated by the diaphragm, an amplifying circuit, a monostable vibrator circuit, and a load actuating circuit.

II. Description of the Prior Art

Up to the present time, there has been a need for electrically driven toys or lighting equipment to work for a predetermined period of time in response to an audible sound.

There has also been a need to produce such equipment at low cost, as well as equipment assemblies durable in construction and reliable in operation.

Various electric circuits are usually incorporated to operate sound responsive equipment. Particularly, transistors or transistor circuits are used in order to meet the demand for compactness of the equipment, and accordingly, moisture or even a speck of dust must be completely excluded to allow reliable operation.

The present invention comprises a household lighting device which works only for a certain period of time, and lights a lamp for about five seconds in response to a sound such as the sound produced by the clapping of hands.

The device has also been provided with an input inhibit circuit to prevent reactivation of the switch by an extraneous sound during the predetermined time period.

OBJECTS OF THE INVENTION

It is therefore an object of the present invention to provide a low cost, compact, reliable sound actuated switch that does not respond to extraneous noise, either electrical or audible, during the preset time period.

It is another object of the present invention to provide a switch which closes a circuit only for a predetermined period of time in response to a sound or sounds.

Another object of the invention is to provide a switch which firmly withstands moisture and prevents the ingress of dust into the electronic circuitry.

A further object of this invention is to provide a time switch suitable for use in speaking toys and to provide a switch of small size which is applicable to various electrically driven equipment.

SUMMARY OF THE INVENTION

According to the present invention, a housing is provided which receives therein electric circuits and other necessary parts or components, and may be of a type exclusively prepared for a particular purpose. Accordingly, an outer housing of a device or equipment itself to which the switch of the invention is applied can also be used for the housing of the switch. In accordance with the present invention a space is defined in an outer housing which is tightly sealed by a diaphragm for receiving a sound or sounds.

In the sealed space at the reverse side of the diaphragm, circuit components, such as a piezo-electric element, as amplifying circuit, a monostable multi-vibrator circuit, a load actuating circuit and an input inhibit circuit, are disposed being completely sealed against the exterior environment by the diaphragm.

In a preferred embodiment, one tip end of the piezo-electric element is fixed to the center of the diaphragm, while the other tip end is attached to the housing.

Remaining electronic circuits are connected in turn, with the amplifying circuit conductively connected to the piezo-electric element, the monstable multi-vibrator circuit connected to the amplifying circuit, and the load actuating circuit connected to the monostable multi-vibrator circuit.

The input inhibit circuit can be optionally connected between the output side of the monostable multi-vibrator circuit and the amplifying circuit.

These circuits are composed of various electronic circuits, for example, a transistor having an amplification effect is used for the amplifying circuit and two transistors and one capacitor are used to constitute the monostable multi-vibrator circuit.

A transistor is used for the load actuating circuit. The input inhibit circuit comprises a resistor and a capacitor.

According to the present invention, a sound passing through small sound apertures formed in the housing is received by a diaphragm and changed into diaphragm vibrations and then transmitted to the piezo-electric element.

Here, the vibration of the diaphragm is converted into electric signals.

The diaphragm substantially seals the interior space of the housing and prevents dust and moisture from affecting the electronic circuit elements disposed therein.

Particularly, when both the diaphragm and the housing are fabricated of plastic, the entire circuit can be effectively protected against moisture and dust.

Electric signals from the piezo-electric element are amplified by the amplifying circuit and then applied to the monostable multi-vibrator circuit which makes the load actuating circuit act for a predetermined period of time. Thus, an actuator is enabled to operate a load for a limited time period.

Addition of the input inhibit circuit prevents the device from reactivation introduced by any undersirable sound or noise given by the action of the device itself or extraneous noise during the predetermined time period.

According to the present invention, an electric current caused by a sound flows to an actuator only for a predetermined period of time thereby enabling the device to perform for a limited time period.

Particularly, the switch means according to this invention can be arranged in compact size with lower cost and is not only able to withstand dust and moisture ingress but also can be applied to various kind of devices requiring action for a limited period of time.

DETAILED DESCRIPTION OF THE PREFERRED EMBODIMENTS

Figure 1:
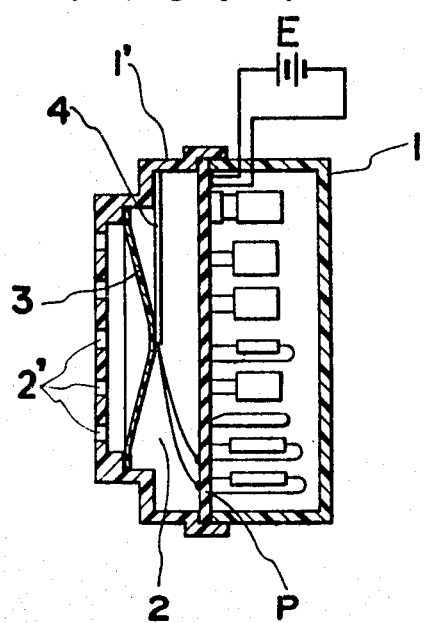
FIG. 1 is a cross sectional elevation showing an embodiment of the device according to the present invention.

FIG. 1 is a cross sectional elevation of an embodiment of the present invention being incorporated in a housing of typical configuration.

A housing consists of a casing 1 having a bottom at its one axial end and being open at the other end. A cover lid 1' is placed around the axial end of said casing 1' to cover the open end, the cover lid 1' having a plurality of sound apertures 2', whereby an interior space 2 is defined by the casing 1 and the cover lid 1'.

Preferably, the casing 1 and the cover lid 1' are fabricated of plastic resinous material.

On the back side of the cover lid 1', namely, on an interior rim thereof, a convex diaphragm 3 for receiving a sound which is made of a press formed thin plastic is adhesively attached.

On the reverse side and at the convex center of the diaphragm 3, one tip end of a narrow piezo-electric element 4 is adhesively attached and the other tip end of said piezo-electric element is supported by the inner periphery of the cover lid 1' such that the vibration of the diaphragm 3 can be readily transmitted to the piezo-electric element 4.

On the axial end face of the casing 1 defining the opening, a plurality of cut-aways, (not shown) are provided so that a wiring base plate P is supported thereat and tightly held by said cover lid 1'.

On this base plate P, the necessary circuit components connected with each other as printed circuits are disposed and are further connected to said piezo-electric element, a power source and an external or built-in member to be actuated by the circuit, such as an actuator.

Figure 2:
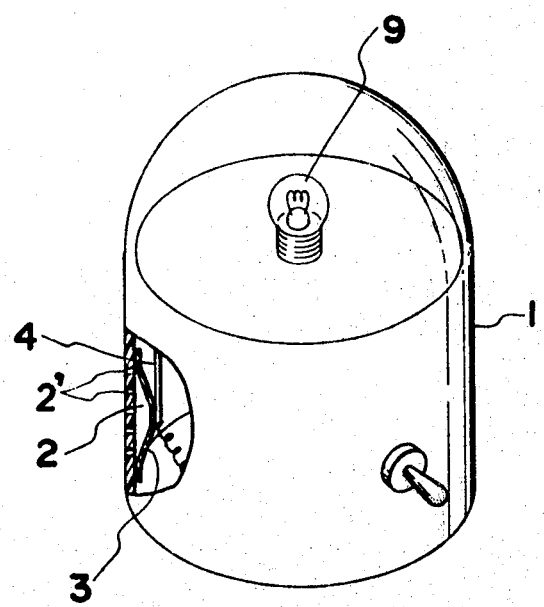
FIG. 2 is a partly fragmented perspective view of another embodiment of the present invention.

FIG. 2 illustrates a partly fragmented perspective view of a time lighting means utilizing the present invention, wherein the top of the casing 1 is formed in a transparent dome in which a small lamp 9 or other suitable electrical load is received.

On the side face of the casing 1, the sound holes 2' are formed, and the side face also forms the part of the opening 2 within the casing 1.

At a part of the exterior portion of the opening, the diaphragm 3 for receiving a sound is adhesively fixed and substantially seals the interior portion of the opening 2 from the outside.

At the center of the reverse side of the diaphragm 3, a means for converting diaphragm movement into an electrical signal such as piezo-electric element 4 is bonded at its one tip end, while the other tip end is fixed to the inner part of the housing. (not shown)

In the embodiment shown in FIG. 2, the housing 1 receives therein a battery (not shown) as a self-contained power source for lighting the lamp 9, as well as other necessary circuit wiring.

Figure 3:
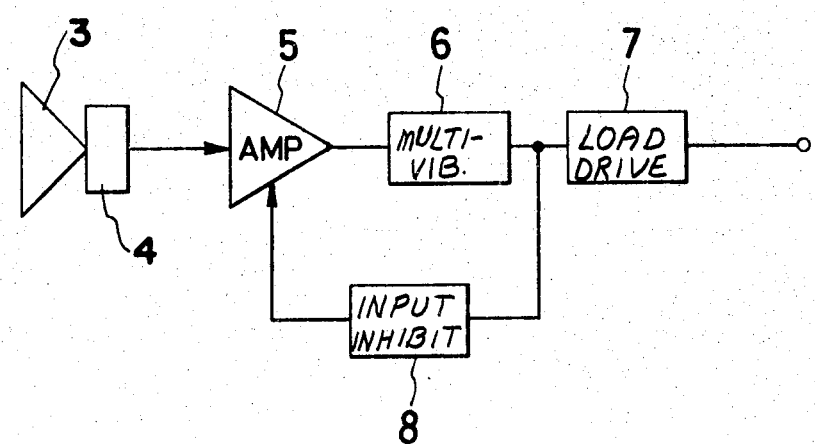
FIG. 3 is a block diagram of an electric circuit used in the device.

As shown in FIG. 3, in the circuit of the present invention, the piezo-electric element 4 fixed to the diaphragm for receiving a sound is connected to an amplifying circuit 3 which is in turn connected to a monostable multi-vibrator circuit 6.

The monostable multi-vibrator circuit 6 is connected to a load drive circuit 7 which is in turn connected to a suitable actuator such as an electromagnetic relay (not shown) which turns the lamp 9 on.

Vibration of the diaphragm 3 is converted by means of the piezo-electric element, into electric signals which are sent to the monostable multi-vibrator circuit 6 after having been amplified by the amplifying circuit 5.

The monostable multi-vibrator circuit 6 acts to maintain the load drive circuit 7 in its ON-state for only a predetermined period of time so that the actuator, such as an electromagnetic relay, may perform a time action, initiated by a sound, to light the small lamp 9 for the predetermined period of time.

Some actuators may generate a noise, or noises either electrical or mechanical, which when operated could induce an unnecessary action signal to the piezo-electric element 4.

In order to prevent the device from an undesired action, an input inhibit circuit 8 may be optionally connected from the output side of the monostable multi-vibrator circuit 6 to the amplifying circuit 5.

Figure 4:
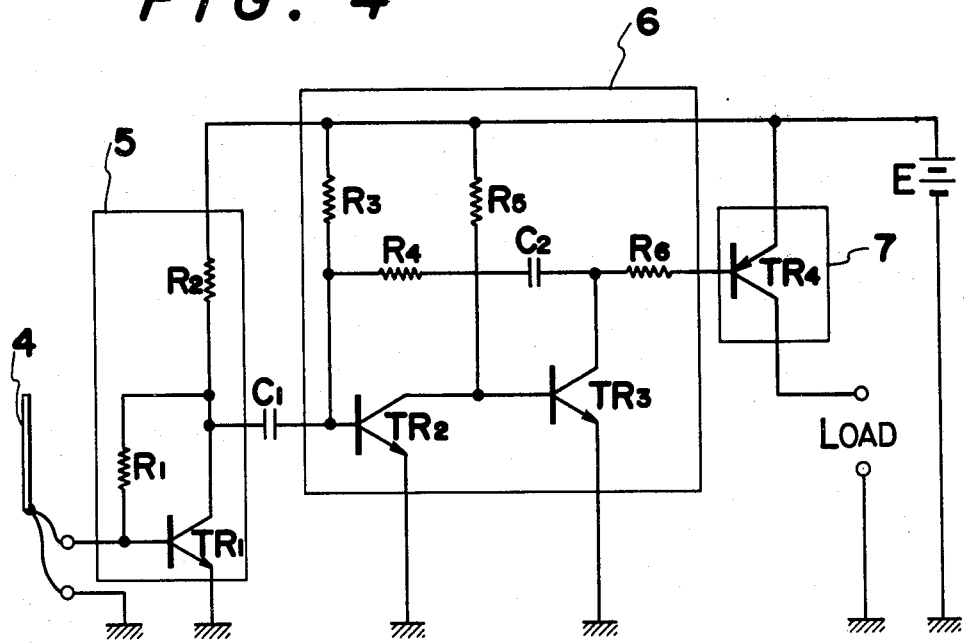
FIG. 4 is a diagram of an embodiment of the electric circuit.
Figure 5:
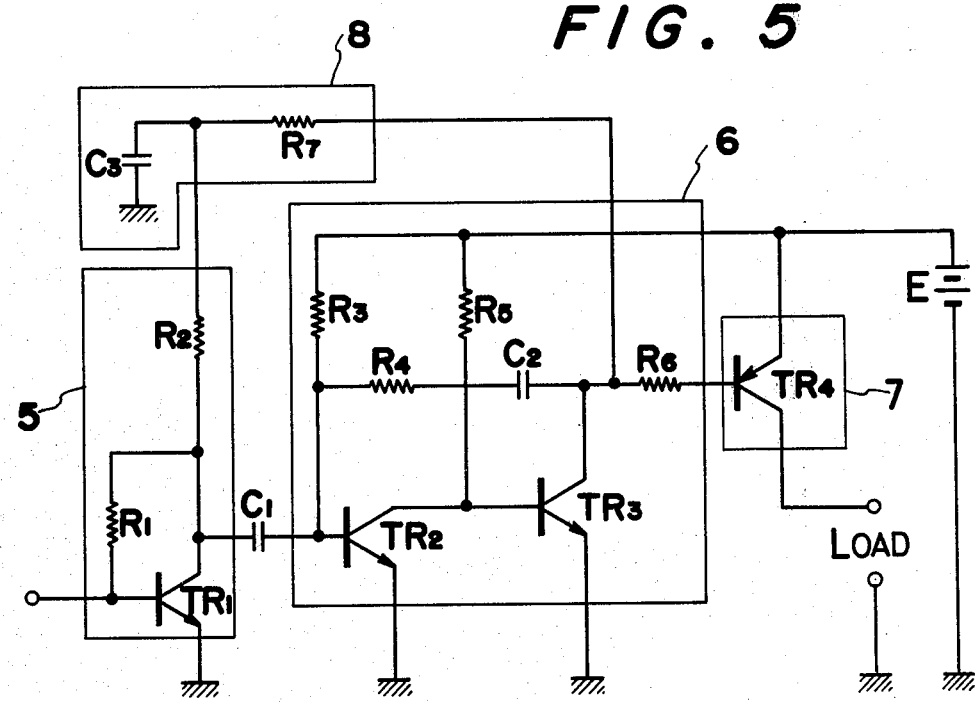
FIG. 5 is a diagram showing another embodiment of the electric circuit with an input inhibit circuit provided.

FIG. 4 and FIG. 5 show the circuit configurations necessary for these embodiments incorporating the input inhibit circuit 8.

As shown in FIG. 4 of the drawing, one terminal at the sensing tip end of the piezo-electric element is grounded and the other terminal is connected to the base of a NPN transistor TR1.

The emitter of said transistor TR1 is grounded and the collector thereof is connected to a power source E through a resistor R2.

The collector and the base of said transistor TR1 are connected to each other through a resistor R1.

In this manner, the amplifying circuit 5 is formed. The amplifying circuit 5 is connected through a first capacitor C1 to the monostable multi-vibrator circuit 6, which consists of two NPN transistors TR2, TR3, resistors R3–R6 and a second capacitor C2.

The collector of the transistor TR1 in the amplifying circuit 5 is connected through the capacitor C1 to the base of the transistor TR2 which is in turn connected to the plus positive terminal of the power source E through a resistor R3.

The emitter of the transistor R2 is grounded, while the collector of the same is connected to the base of said transistor TR3.

The collector of the transistor TR2 is connected also to the positive terminal of the power source E through a resistor R5.

The emitter of said transistor TR3 is grounded and its collector is connected to the base of the transistor TR2 through the capacitor C2 and a resistor R4.

The load drive circuit 7 comprises a PNP transistor TR4, the base of which is connected to the collector of the transistor TR3 through a resistor R6.

The emitter of the transistor TR4 is connected to the positive terminal of the power source E and the collector with an output terminal is connected to the load.

In the present embodiment, when there is no input signal from the piezo-electric element 4, the transistor TR1 is OFF, and the capacitor C1 is charged by the current flowing through the resistor R2, capacitor C2 and the base of the transistor TR2.

The transistor TR2 is ON by the base current flowing through the resistor R3, so that the transistors TR3 and TR4 are OFF and no driving current flows to the output terminal.

Under this condition, the capacitor C2 is charged through the transistor TR4, the resistors R6 and R4, and the transistor TR2 in this order.

An input signal from the piezo-electric element 4 is amplified, upon its entering, by the transistor TR1 in the amplifying circuit 5, that is, conductivity of the transistor TR1 increases and the current flows through the resistor R3 and the capacitor C1 into the collector of the transistor TR1 thereby discharging the capacitor C1 and lowering the base potential of the transistor TR2 to turn it OFF. This enables the base current to flow passing through the resistor R5 into TR3, thereby turning the transistor TR3 ON which, in turn, turns the transistor TR4 ON.

At this moment, the plus side of the capacitor C2, that is, the side connected to the collector of the transistor TR3 reaches almost zero potential, so that the base of the transistor TR2 is biased to minus or negative potential. Thus, this condition is maintained until the capacitor C2 has been discharged, even if no signal is given to the input terminal.

This allows a timed flow of the current to the output terminal.

Depending upon the kind and nature of the load to be connected to the output terminal, there may arise some mechanical or electrical noise at the moment when the output is turned OFF from its ON-state so that the circuit in the device may wrongly function to cause an unwanted repeated operation.

In order to avoid the occurance of an unwanted repeated operation, it is necessary to restrain the input from entering for a predetermined period of time from the moment when the input changes to the OFF state.

FIG. 5 shows an embodiment which further comprises an input inhibit circuit for the aforesaid purpose.

The collector of the transistor TR1 in the amplifying circuit 5 is connected, instead of being connected to the power source through the resistor R2, to the collector of the transistor TR3 through a resistor R7. The connection between the resistors R2 and R7 is grounded through a capacitor C3.

The resistor R7 and the capacitor C3 constitute the input inhibit circuit 8, through which the capacitor C3 is discharged when the transistor TR3 is ON, so that the transistor TR1 does not function, and therefore, the amplifying circuit 5 does not operate.

Even if the transistor TR3 is turned off, the inout signal is inhibited because the amplifying circuit 5 cannot operate for a predetermined period of time until the capacitor C3 has been charged.

According to the present invention, switch means responsive to a sound can be obtained with low cost and having simple and reliable construction, which is further applicable to various kinds of electrically operated machines or apparatus.

I claim:

1. A sound actuated switching apparatus to allow an electrical current to flow for a predetermined period of time comprising:
   a vibratory element adapted to be vibrated by sound;
   means connected to said vibratory element for converting vibrations of said vibratory element into electrical signals;
   means, electrically connected to said converting means, for amplifying said electrical signals from said converting means;
   load driving means for operating an electrical load;
   means, connected to said amplifying means, for allowing an electrical current to flow to said load driving means for a predetermined period of time after the initiation of said electrical signals from the converting means; and
   input inhibit means, responsive to said current flow allowing means, for inhibiting an output from said amplifying means for a predetermined period of time after the flow of electrical current to said load driving means has terminated.

2. The switching apparatus as claimed in claim 1 wherein:
   the vibratory element comprises a diaphragm;
   the converting means comprises a piezo-electric element; and
   the current flow allowing means comprises a monostable multi-vibrator circuit.

3. A switching apparatus responsive to a sound for allowing an electrical current to flow for a predetermined period of time comprising:
   a housing;
   a space formed in said housing and being in acoustic communication with the exterior thereof through an opening formed in said housing therein;
   a vibratory element fixed to said housing so as to seal said opening from the exterior, said vibratory element adapted to be vibrated by a sound;
   means, fixedly supported on said housing and connected to said vibratory element, for converting vibrations of said vibratory element into electrical signals;
   amplifying means, electrically connected to said connecting means, for amplifying said electrical signals from said converting means;
   load driving means for operating an electrical load;
   means, connected to said amplifying means, for allowing an electrical current to flow to said load driving means for a predetermined period of time after said electrical signals are first generated by the converting means; and
   input inhibit means, responsive to said allowing means, for inhibiting an output from said amplifying means for a predetermined period of time after the flow of electrical current to said load driving means has terminated.

4. The switching apparatus as claimed in claim 3 wherein the vibratory element comprises a diaphragm and the converting means comprises a piezo-electric element.

5. The switching apparatus as claimed in claim 4, wherein said diaphragm is fabricated of a material having sufficient softness that it can be deformed by a sound and cause activation of the piezo-electric element.

6. The switching apparatus as claimed in claim 4 wherein said piezo-electric element, the amplifying means, the load driving means, the current flow allowing means and the input means are received in said housing and said diaphragm constitutes a substantial seal cover whereby said piezo-electric element, the amplifying means, the load driving means, the current flow allowing means and the input inhibit means are enclosed in an air tight condition in said housing.

7. The switching apparatus as claimed in claim 1, wherein said diaphragm is formed of a thin plastic sheet and said housing is fabricated from a rigid plastic material, said diaphragm being adhesively bonded to said housing.

8. The switching apparatus as claimed in claim 3, wherein said amplifying means comprises a first transistor, a base of which is connected to said converting means and a collector of which is connected to a power source, and said current flow allowing means includes a second transistor disposed at its input side and a third transistor disposed at its output side, a base of said second transistor being connected through a first capacitor to the collector of said first transistor and a collector of said second transistor being connected to a base of said third transistor;

a collector of said third transistor being connected through a second capacitor to the base of said second transistor and also to said load driving means; and said load driving means comprises a fourth transistor, a base of which is connected to the collector of said third transistor and an emitter of which is connected to an output terminal of said switching apparatus.

9. The switching apparatus as claimed in claim 8 wherein said input inhibit means comprises a resistor interposed between the base of said fourth transistor and the collector of said first transistor to supply a voltage from the base of said fourth transistor, and a third capacitor connected to a junction between said resistor and the collector of said first transistor.

10. A sound actuated switching apparatus to allow an electrical current to flow for a predetermined period of time comprising:

a housing including a space in acoustic communication with the exterior thereof, and having an opening in communication with said housing interior;

a diaphragm sufficiently soft to be vibrated by a sound, said diaphragm adhesively attached at the periphery thereof to the perimeter of said opening sealing said housing interior;

a piezo-electric element fixedly supported by said housing at one end and fixedly attached said diaphragm at another end;

an amplifying circuit electrically connected to said piezo-electric element;

a monostable multi-vibrator circuit connected to said amplifying circuit and a load driving relay connected to said monostable multi-vibrator circuit;

an inhibit circuit comprising a resistance and a capacitor interposed between said amplifier circuit and said monostable multi-vibrator circuit; and wherein a noise causes the diaphragm to vibrate inducing a current to flow from said piezo-electric element which current is amplified by said amplifier and causes activation of said multi-vibrator circuit to close said load driving relay, and wherein said inhibit circuit inhibits an output from said amplifying circuit for a predetermined period of time after the flow of electrical current has terminated.

* * * * *